US012648498B2

(12) United States Patent
Chen et al.

(10) Patent No.: US 12,648,498 B2
(45) Date of Patent: Jun. 2, 2026

(54) SURFACE TREATMENT IN INTEGRATED CIRCUIT PACKAGE AND METHOD

(71) Applicant: Taiwan Semiconductor Manufacturing Co., Ltd., Hsinchu (TW)

(72) Inventors: Chen-Shien Chen, Zhubei (TW); Chi-Yen Lin, Tainan (TW); Po-Chen Chen, Hsinchu (TW); Wu-An Weng, Hsinchu (TW); Hsu-Hsien Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 398 days.

(21) Appl. No.: 18/501,254

(22) Filed: Nov. 3, 2023

(65) Prior Publication Data

US 2025/0062201 A1 Feb. 20, 2025

Related U.S. Application Data

(60) Provisional application No. 63/532,456, filed on Aug. 14, 2023.

(51) Int. Cl.
H01L 23/49 (2006.01)
H01L 21/02 (2006.01)
(Continued)

(52) U.S. Cl.
CPC .. H01L 23/49816 (2013.01); H01L 21/02052 (2013.01); H01L 21/6836 (2013.01); H01L 24/05 (2013.01); H01L 24/97 (2013.01);

H01L 25/0655 (2013.01); H01L 2224/05025 (2013.01); H01L 2224/97 (2013.01); H01L 2924/1431 (2013.01); H01L 2924/1434 (2013.01);
(Continued)

(58) Field of Classification Search
CPC ......... H01L 23/49816; H01L 21/02052; H01L 21/6836; H01L 24/05; H01L 24/97; H01L 25/0655; H01L 24/08; H01L 24/80; H01L 25/18; H01L 25/50; H01L 23/5386
See application file for complete search history.

(56) References Cited

U.S. PATENT DOCUMENTS 6,329,268 B1    12/2001  Nakamori et al.
8,993,380 B2     3/2015  Hou et al.
(Continued)

FOREIGN PATENT DOCUMENTS

JP          2016025267 A      2/2016
KR       20090027598 A      3/2009
(Continued)

*Primary Examiner* — S M Sohel Imtiaz
(74) *Attorney, Agent, or Firm* — Slater Matsil, LLP

(57) ABSTRACT

A package includes a first integrated circuit die and a second integrated circuit die over and bonded to the first integrated circuit die. A first surface region of the second integrated circuit die is hydrophobic, and the first integrated circuit die and the second integrated circuit die are bonded together with dielectric-to-dielectric bonds and metal-to-metal bonds. The package further includes a first insulating material over the first integrated circuit and surrounding the second integrated circuit die. The first insulating material contacts the first surface region.

20 Claims, 11 Drawing Sheets

(51) Int. Cl.
     *H01L 21/683*        (2006.01)
     *H01L 23/00*         (2006.01)
     *H01L 23/498*        (2006.01)
     *H01L 25/065*        (2023.01)
(52) U.S. Cl.
     CPC ............... *H01L 2924/15311* (2013.01); *H01L*
                                         *2924/18161* (2013.01)

(56)                References Cited

U.S. PATENT DOCUMENTS 9,281,254  B2     3/2016   Yu et al.
     9,299,649  B2     3/2016   Chiu et al.
     9,372,206  B2     6/2016   Wu et al.
     9,425,126  B2     8/2016   Kuo et al.
     9,443,783  B2     9/2016   Lin et al.
     9,461,018  B1    10/2016   Tsai et al.
     9,496,189  B2    11/2016   Yu et al.
     9,666,502  B2     5/2017   Chen et al.
     9,735,131  B2     8/2017   Su et al.
  2009/0067659  A1     3/2009   Wang et al.
  2015/0179561  A1*    6/2015   Wu ................... H01L 23/49838
                                                          174/255

2016/0013138  A1*    1/2016   Chen ................... H01L 21/6835
                                                          257/774
  2016/0035670  A1*    2/2016   Chen .................... H01L 21/768
                                                          438/107
  2017/0117250  A1*    4/2017   Xie ...................... H01L 25/0655
  2018/0068985  A1*    3/2018   Chiu ................... H01L 25/0657
  2018/0122781  A1*    5/2018   Chen ..................... H01L 24/49
  2018/0211901  A1*    7/2018   Hung ................... H01L 23/481
  2018/0323177  A1*   11/2018   Yu ........................ H01L 21/568
  2019/0131277  A1*    5/2019   Yang ..................... H01L 22/32
  2019/0244918  A1*    8/2019   Chang .................. H01L 23/293
  2020/0161263  A1     5/2020   Chen et al.
  2020/0227331  A1*    7/2020   Yu ...................... H01L 23/3114
  2020/0273724  A1     8/2020   Chen et al.
  2022/0157732  A1*    5/2022   Tsai ................... H01L 23/5389
  2024/0047343  A1*    2/2024   Tong ................. H01L 23/5226
  2025/0015027  A1*    1/2025   Lu ...................... H01L 21/4853

FOREIGN PATENT DOCUMENTS

KR        20100032361  A      3/2010
     KR        20200060670  A      6/2020
     TW              441048 B      6/2001
     TW              533452 B      5/2003

* cited by examiner

SURFACE TREATMENT IN INTEGRATED CIRCUIT PACKAGE AND METHOD

PRIORITY CLAIM AND CROSS-REFERENCE

This application claims the benefits of U.S. Provisional Application No. 63/532,456, filed on Aug. 14, 2023, which application is hereby incorporated herein by reference in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
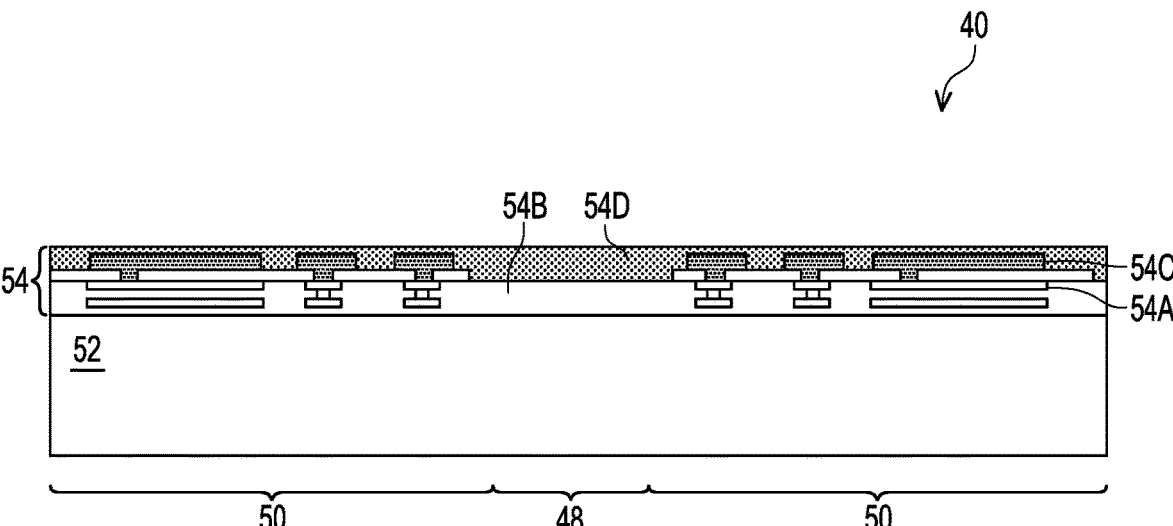
FIGS. 1, 2, 3, 4A, 4B, 4C, 5, and 6 illustrate cross-sectional views of various intermediate steps of singulating an integrated circuit die in accordance with various embodiments.
Figure 2:
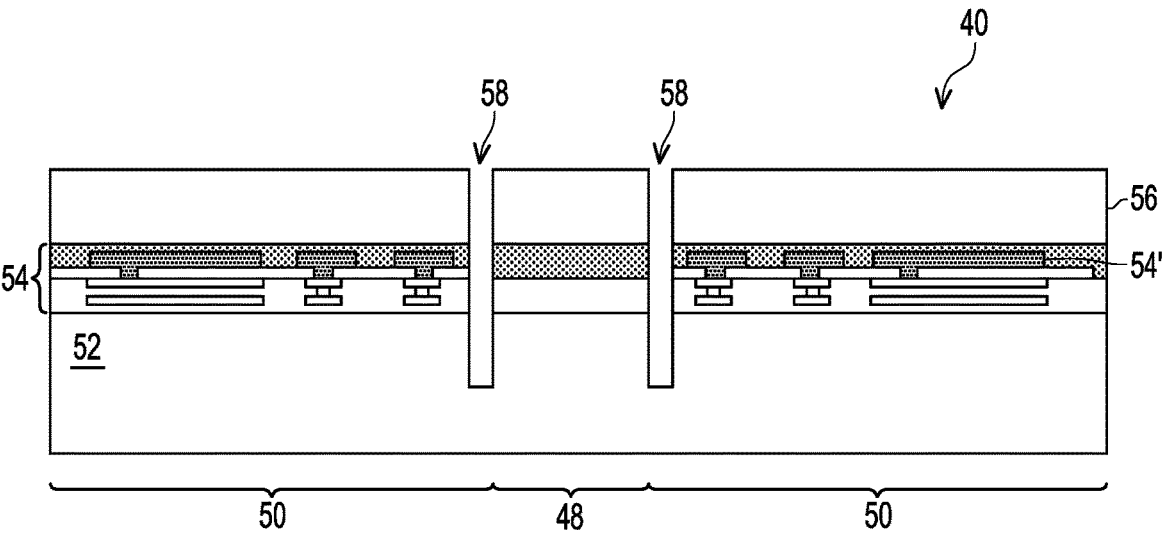

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a singulation process is performed to separate individual semiconductor dies from a wafer. The singulation process may include patterning trenches in the scribe line regions of the wafer, and performing a surface treatment to provide hydrophobic sidewalls in the trenches. In some embodiments, the surface treatment is a fluorine-based treatment. The hydrophobic sidewalls may prevent a protective layer (e.g., a back side anti-reflective coating (BARC) layer or the like) from being deposited in the trenches in a subsequent singulation step. A planarization process may then be performed to remove a backside of the wafer, separating the semiconductor dies along the trenches.

The protective coating layer may protect the semiconductor dies during the planarization process, and cleaning process may be used to remove the protective layer after the planarization process. Because the protective layer is not deposited in the trenches, the cleaning process may more effectively remove the protective layer, improving yield and reducing re-constructive wafer (RW) tool failure. For example, when the protective layer fills the trenches, the semiconductor dies may not be successfully separated from the wafer, resulting in RW failure. As another example, the protective layer remaining on sidewalls of the singulated, semiconductor die may result in defects when the semiconductor die is packaged with other components in a semiconductor package. By converting the sidewalls of the trenches to be hydrophobic through the fluorine-based treatment, such defects can be avoid and yield can be improved.

FIG. 1 is a cross-sectional view of a wafer 40, which includes integrated circuit dies 50. The integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit dies 50 may be formed in the wafer 40, which may include different device regions that are singulated in subsequent steps to form a plurality of integrated circuit dies 50. Specifically, the device regions may be separated by scribe line regions 48 in which the subsequent singulation process is performed. In some embodiments, the scribe line regions

48 provide test lines, which can be used to perform electrical tests and/or yield tests during the manufacturing process. The integrated circuit dies 50 each include a semiconductor substrate 52, an interconnect structure 54, and bond pads 66 disposed in an insulating bonding layer 68.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form one or more integrated circuits. The interconnect structure 54 may include metallization pattern(s) 54A in one or more the dielectric layer(s) 54B. Acceptable dielectric materials for the dielectric layers 54B include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used. The metallization patterns 54A may include conductive vias and/or conductive lines to interconnect the devices of the semiconductor substrate 52. The metallization patterns 54A may be formed of a conductive material, such as a metal, such as copper, cobalt, aluminum, gold, combinations thereof, or the like. The interconnect structure 54 may be formed by a damascene process, such as a single damascene process, a dual damascene process, or the like. The interconnect structure 54 may further include metal pads 54C (e.g., aluminum pads, copper pads, or the like), which are connected to a top-most metallization pattern 54A of the interconnect structure 54 through one or more passivation layers. An additional insulating layer (e.g., a passivation layer 54D) may be formed around the metal pads 54C to provide a planar surface on which to form the overlaying features (e.g., bond pads 66 and an insulating bonding layer 68, see FIG. 5).

FIGS. 2 through 4C are varying views of intermediate steps during a singulation process to separate the integrated circuit dies 50 from the wafer 40. Starting with FIGS. 2, trenches 58 are formed extending through the interconnect structure 54 and into the semiconductor substrate 52. The trenches 58 may be patterned in the scribe line region 48 between adjacent integrated circuit dies 50. In some embodiments, the scribe line region 48 may be wide enough to accommodate the trenches 58 and a test line region for the wafer 40.

In some embodiments, the trenches 58 are formed with combination of photolithography and etching processes. For example, the trenches 58 may be formed in a plasma dicing process in the scribe line regions 48. The plasma dicing process may include forming a patterned mask 56 over the interconnect structure. The patterned mask 56 may be a photomask that is deposited in a spin-on process over the interconnect structure 54 and patterned by lithography (e.g., exposure and development) to define openings that expose the interconnect structure 54 in the scribe line 48. The plasma dicing process etches portions of the interconnect structure 54 and the semiconductor substrate 52 through the patterns (e.g., openings) in the patterned mask 55. In some embodiments, the plasma dicing is a dry plasma process such as Reactive Ion Etching (RIE) using a fluorine-based plasma, an argon-based plasma, an oxygen-based plasma, a nitrogen-based plasma, or the like. The trenches 58 may extend through the interconnect structure 54 to a desired depth into the semiconductor substrate 52. However, the trenches 58 may not extend fully through the semiconductor substrate 52, and lower portions of the semiconductor substrate 52 may remain to connect the integrated circuit dies 50 together in the wafer 40.

Figure 3:
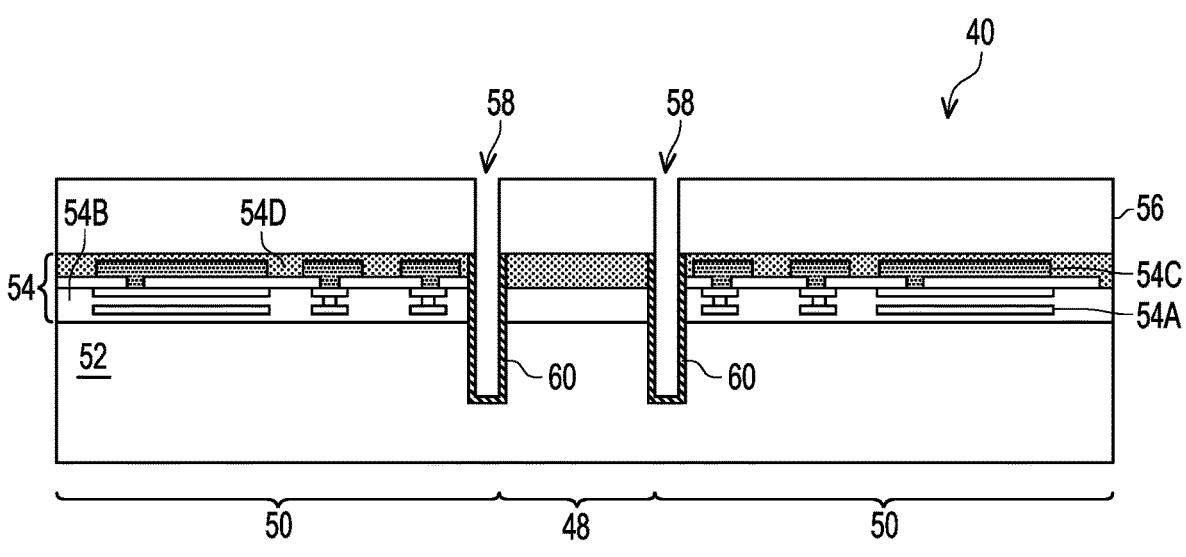

In FIG. 3, a surface treatment is performed in the trenches 58 to form surface regions 60 on exposed surfaces of the trenches 58. The surface regions 60 may be hydrophobic. In some embodiments, the surface treatment is a fluorine-based treatment, such as a wet cleaning process using a fluorine-comprising solution, a fluorine-based plasma process, or the like. In some embodiments, the fluorine-based plasma process may be performed at a temperature in a range of 25° C. to 500° C. and at a pressure of 0 Torr to $1.316 \times 10^{-3}$ Torr (one atmosphere). Other treatments that form hydrophobic surfaces may be applied in other embodiments. The surface treatment makes the surfaces of the trenches 58 hydrophobic so that a subsequently formed protective layer (e.g., protective layer 62, see FIG. 4A) can be deposited over the interconnect structure 54 without being significantly deposited in the trenches 58. When the surface treatment is a fluorine-based treatment, the resulting surface regions 60 may likewise comprises fluorine and be referred to as a fluorinated protection layer 60. For example, surface regions 60 may comprise 5 weight % (wt %) or more fluorine, which advantageously results in hydrophobic surfaces in the trenches 58. It has been observed that when the surfaces regions 60 have less than 5 wt % of fluorine, they may remain hydrophilic and not significantly prevent deposition of the subsequently formed protective layer in the trenches 58. The surface regions 60 may further comprise carbon, oxygen, silicon, nitrogen, or a combination thereof. The specific material composition of the surface regions 60 may depend on a material of the interconnect structure 54 and/or semiconductor substrate 52 on which the surface regions 60 are formed. For example, portions of the surface regions 60 on the semiconductor substrate may comprise fluorine and silicon while portions of the surface regions 60 on the interconnect structure 54 may comprise fluorine in combination with carbon, oxygen, nitrogen and/or silicon. A thickness T1 of the surface regions 60 may be in a range of 60 Å to 10 μm.

The surface treatment may be performed while the patterned mask 56 covers the interconnect structure 54. As a result, the surface regions 60 can be selectively formed in the trenches 58 without blanket forming the surface regions 60 over the interconnect structure 54. For example, after the surface treatment, top surface of the interconnect structure 54 may remain hydrophilic so that a protective layer can be deposited thereon (e.g., the protective layer 62, see FIG. 4A). After the surface treatment, the patterned mask 56 may be removed. For example, when the patterned mask 56 is a photomask, the patterned mask 56 may be stripped away with an ashing process.

Figure 4A:
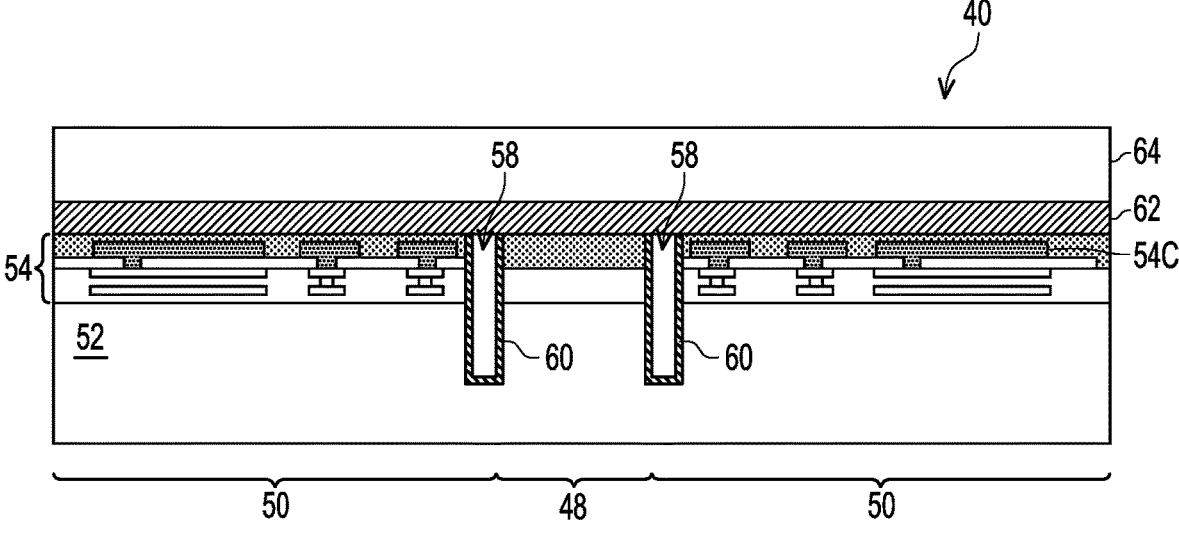

In FIG. 4A, a protective layer 62 is deposited over interconnect structure 54. In some embodiments, the protective layer 62 is a BARC layer that is deposited by a spin-on process, or the like. As a result of the surface treatment and the hydrophobic surface regions 60, the protective layer 62 may not be significantly deposited within the trenches 58. Keeping the protective layer 62 from being deposited in the trenches 58 achieves advantages such as reduced manufacturing defects and improved yield.

Figure 4B:
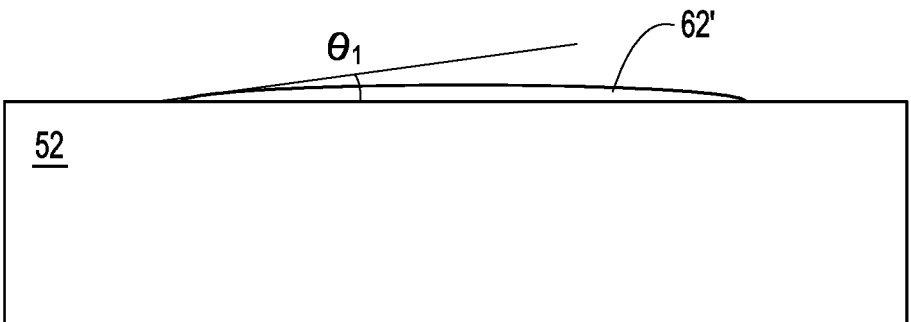

For example, FIG. 4B illustrates a material 62' of the protective layer 62 on an untreated substrate 52. Because the surface treatment process described above was not performed and no surface region 60 is formed in FIG. 4B, surfaces of the substrate 52 remain hydrophilic. Specifically, the hydrophilic characteristic of the substrate 52 may be measured by a contact angle θ, at a liquid-vapor interface between the material 62' and the semiconductor substrate 52 being less than 10°. The material 62' may be easily deposited on the hydrophilic surfaces (e.g., filling at least upper portions of the trenches 58), and the integrated circuit dies 50 may not fully separate after subsequent planarization processes (see FIG. 5). For example, the protective layer 62 may plug the trenches 58 and adhere adjacent integrated circuit dies 50 together, preventing separation of the integrated circuit dies 50. Even when the integrated circuit dies 50 are fully singulated, the protective layer 62 may leave an undesired residue on sidewalls of the singulated integrated circuit dies 50. The residue may result in manufacturing defects (e.g., gap fill voids) during subsequent packaging processes.

Figure 4C:
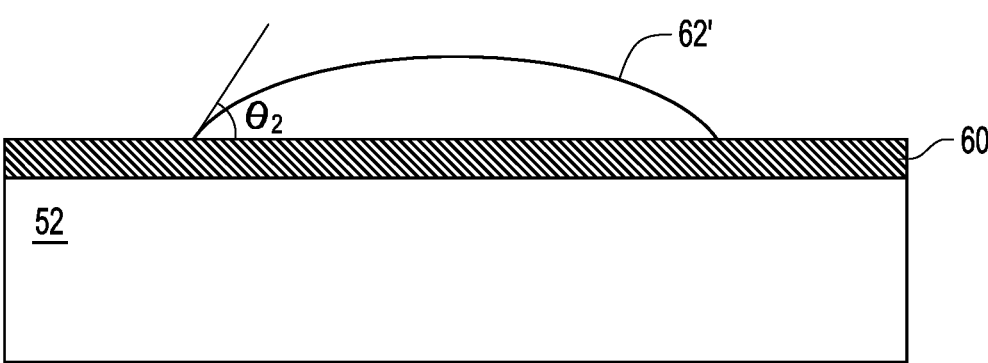

In contrast, FIG. 4C illustrates the material 62' of the protective layer 62 on the substrate 52 with a surface region 60, which is formed with the surface treatment described above. The surface region 60 provides a hydrophobic surface that repels the material 62' and prevents the material 62' from being deposited within the trenches 58. The hydrophobic characteristic of the surface region 60 may be evidenced by the contact angle θ₂ at a liquid-vapor interface between the material 62' and the surface region 60 being greater than 10°. Because the surface regions 60 repel the protective layer 62, the integrated circuit dies 50 can be more readily singulated and undesired residue on sidewalls of the singulated integrated circuit dies 50 can be avoided.

As also illustrated by FIG. 4A, a tape 64 is adhered to the wafer 40, such as to a top surface of the protective layer 62. The tape 64 supports the wafer 40 during subsequent singulation processes, and the protective layer 62 acts as an intermediary, buffer between the wafer and the tape 64. For example, the protective layer 62 protects a top surface of the interconnect structure 54 from direct contact with the tape 64, reducing the risk of damage to the interconnect structure 54.

Figure 5:
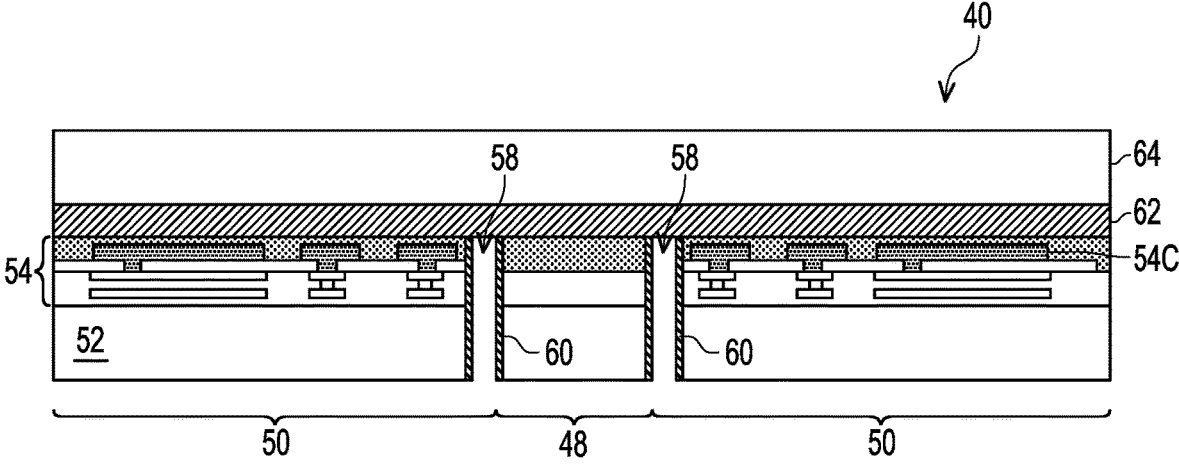

In FIG. 5, a backside planarization process is performed to thin the semiconductor substrate 52. The planarization process may be performed to remove portions of the semiconductor substrate 52 beyond the trenches 58. Specifically, the planarization process removes portions of the semiconductor substrate 52 that connect the integrated circuit dies 50 and exposes the trenches 48 from the backside of the semiconductor substrate 52. In some embodiments, the planarization process is a CMP process, a mechanical grinding process, an etch-back process, combinations thereof, or the like.

After the backside planarization process is performed on the semiconductor substrate 52, the tape 64 may be removed, and a cleaning process may be performed to remove the protective layer 62. The cleaning process may be a wet clean, or the like using a suitable cleaning solution. In some embodiments, the cleaning solution may comprise deionized water (DI water), an alkaline solution, an ammonia-based solution (e.g., comprising Na, K, C, O, H, or the like), combinations thereof, or the like. Because the protective layer 62 is not significantly deposited within the trenches 58, the protective layer 62 may be more readily removed by the cleaning process without leaving a desired residue or portions that inadvertently adhere the integrated circuit dies 50 together. As a result, the integrated circuit dies 50 may be fully separated from each other as illustrated by FIG. 6.

Figure 6:
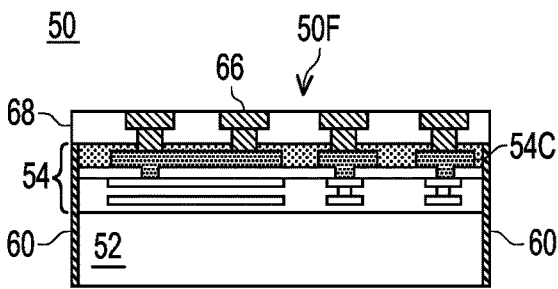

FIG. 6 illustrates a single integrated circuit die 50 after the singulation process described above in FIGS. 2 through 5. In the illustrated embodiment, the surface region 60 is formed on opposing sidewalls of the integrated circuit die 50 as a result of the singulation process described above. In other embodiments (e.g., when the integrated circuit die 50 is at a wafer edge for example), at least one sidewall of the integrated circuit die 50 may be free of the surface region 60 (see e.g., FIGS. 14B and 18B).

Further, bond pads 66 are formed in an insulating bonding layer 68 on the front side 50F of the integrated circuit die 50. The bond pads 66 may be conductive pillars, pads, or the like, to which external connections are made. The bond pads 66 can be formed of a metal, such as copper, aluminum, or the like, and can be formed by, for example, plating, or the like. In some embodiments, the bond pads 66 may be electrically connected to conductive features of the interconnect structure 54 (e.g., the metal pads 54C) by conductive vias (sometimes referred to as bond pad vias).

The bond pads 66 may be disposed in an insulating bonding layer 68 at the front side 50F of the integrated circuit die 50. The insulating bonding layer 68 may be made of a material suitable for subsequent dielectric-to-dielectric bonding, such as, silicon oxide, silicon oxynitride, or the like. The insulating bonding layer 68 may be deposited on the interconnect structure, for example, by spin coating, lamination, chemical vapor deposition (CVD), or the like. The bond pads 66 may be formed in the insulating bonding layer with a damascene process for example, and a planarization process (e.g., a chemical mechanical polish (CMP) or the like) may be performed such that top surfaces of the bond pads 66 and the insulating bonding layer 68 are coplanar (within process variations) and are exposed at the front side 50F of the integrated circuit die 50. As will be described in greater detail below, the planarized front side 50F of the integrated circuit die 50 will be directly bonded to another package component, such as another integrated circuit die.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias or through-silicon vias (TSVs). Each of the semiconductor substrates 52 may (or may not) have a separate interconnect structure 54.

FIGS. 7 through 14B are cross-sectional views of intermediate steps during a process for forming integrated circuit packages, in accordance with some embodiments where the integrated circuit dies 50 are packaged with other package components. Details of the integrated circuit dies 50 may be simplified in FIGS. 7 through 14B for ease of illustration.

While FIGS. 7 through 14B illustrate a particular package configuration (e.g., a system on integrated chip (SoIC) packaging configuration), but it should be appreciated that other package configurations (e.g., integrated fan-out (InFO) packaging, chip-on-wafer-on-substrate (CoWoS) packaging, or the like) may be used as well.

In FIGS. 7 through 14B, integrated circuit packages 150 (labeled 150A and 150B, see FIGS. 14A and 14B) are formed by bonding integrated circuit dies 50 to an integrated circuit die 70 on a carrier substrate 100. Because the integrated circuit dies 50 are bonded over the integrated circuit die 70, the integrated circuit dies 50 and the integrated circuit die 70 may also be referred to as top integrated circuit dies 50 and a bottom integrated circuit die 70, respectively.

Figure 7:
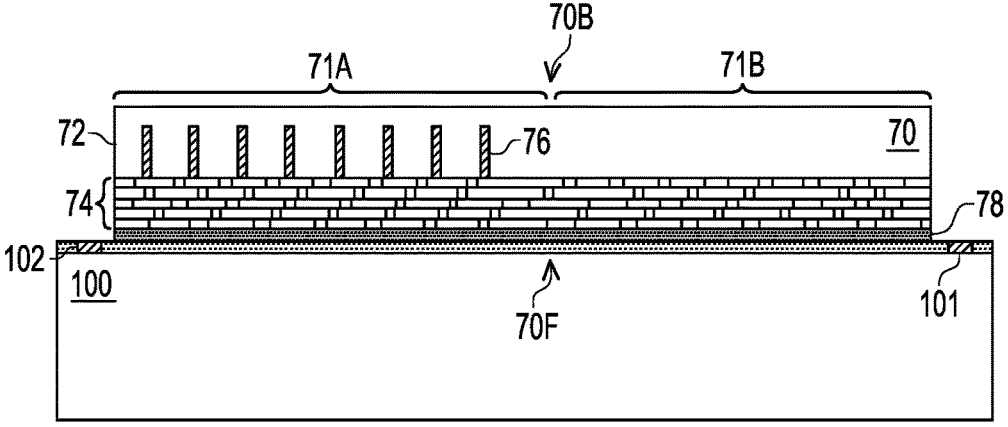
FIGS. 7, 8, 9, 10, 11, 12, 13, 14A, and 14B illustrate cross-sectional views of various intermediate steps of packaging an integrated circuit die in accordance with various embodiments.

Referring first to FIG. 7, the integrated circuit die 70 is illustrated on a carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. An insulating bonding layer 102 is disposed on a top surface of the carrier substrate 100. The insulating bonding layer 102 may comprise a silicon-containing dielectric material such as silicon oxide, silicon nitride, silicon oxynitride, or the like that is deposited using a suitable deposition process such as CVD, PVD, ALD, high-density plasma chemical vapor deposition (HDPCVD, or the like. In some embodiments, alignment marks 101 are optionally disposed in the insulating bonding layer 102. The alignment marks 101 may facilitate accurate placement of structures (e.g., the integrated circuit die 70) on the carrier substrate 100. Optionally, a planarization step may then be performed to level a top surface of the insulating bonding layer 102 such that the insulating bonding layer 102 has a high degree of planarity.

The integrated circuit die 70 may be attached to the carrier substrate 100. The integrated circuit die 70 are disposed face down such that the front sides 70F of the integrated circuit die 70 faces the carrier substrate 100 and the back sides 70B of the integrated circuit die 70 face away from the carrier substrate 100. The integrated circuit die 70 includes a substrate 72, an interconnect structure 74, conductive vias 76 in the substrate 72, and an insulating bonding layer 78.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In some embodiments, active devices such as transistors, diodes, and the like, may be formed in and/or on the front side of the substrate 72. In some embodiments, passive devices such as capacitors, resistors, or the like may be formed in addition to or in lieu of the active devices on the front side of the substrate 72.

The interconnect structure 74 is over the front surface of the substrate 72, and is used to electrically connect the devices of the substrate 72. As such, the front side 70F of the integrated circuit die 70 may refer to a side of the substrate 72 on which the interconnect structure 74 and any devices are disposed. The interconnect structure 74 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect any devices together and/or to an external device. The metallization patterns may be formed of a conductive material, such as a metal, such as copper, cobalt, aluminum, gold, combinations thereof, or the like. The interconnect structure 74 may be formed by a damascene process, such as a single damascene process, a dual damascene process, or the like.

The conductive vias 76 are embedded in the substrate 72 and/or the interconnect structure 74. The conductive vias 76 are electrically coupled to metallization patterns of the interconnect structure 74. The conductive vias 76 are also sometimes referred to as TSVs. As an example to form the conductive vias 76, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 76. The conductive vias 76 are electrically connected to the metallization patterns of the interconnect structure 74.

In some embodiments, the conductive vias 76 may be formed in a first region 71A of the integrated circuit die 70 without being formed in a second region 71B of the integrated circuit die 70. The second region 71B may correspond to a location on which a dummy die may be subsequently bonded for improved heat dissipation (e.g., dummy die 80, see FIG. 10) In other embodiments, the conductive vias 76 may be formed uniformly throughout the integrated circuit die 70.

The integrated circuit die 70 may be formed initially as part of a wafer that is subsequently singulated to separate the integrated circuit die 70 from other components of the wafer. In the illustrated embodiments, the integrated circuit die 70 is singulated without performing the surface treatment described above with respect to FIGS. 2-5. As such, sidewall surfaces of the integrated circuit die 70 may be hydrophilic and may be free of any surface regions. For example, sidewalls of the integrated circuit die 70 may be completely free of any fluorine-comprising surface regions or have less than 5 wt % of fluorine. In other embodiments, the singulation process may be substantially similar to the singulation process described above in FIGS. 2-5. In such embodiments, sidewalls of the integrated circuit die 70 may include surface regions that are hydrophobic (e.g., having fluorine-comprising surface regions with more than 5 wt % of fluorine). Such embodiments are described subsequently in the embodiment of FIGS. 15 through 18B.

An insulating bonding layer 78 is formed on the front side of the integrated circuit die 70, such as on the interconnect structure 74. The insulating bonding layer 78 may be formed a similar material using similar processes as the insulating bonding layer 102, described above. The integrated circuit die 70 may be attached to the carrier substrate 100 by bonding the insulating bonding layers 102 and 78 together using a dielectric-to-dielectric bonding process e.g. oxide-to-oxide bonding). The dielectric-to-dielectric bond may be initiated by activating the insulating bonding layer 102 and/or the insulating bonding layer 78 followed by applying pressure, heat and/or other bonding process steps to join the insulating bonding layer 102 to the insulating bonding layer 78 surfaces. Activating the insulating bonding layer 102 and/or the insulating bonding layer 78 may be performed using, e.g., a dry treatment, a wet treatment, a plasma treatment, exposure to $H_2$, exposure to $N_2$, exposure to $O_2$, combinations of these, or the like. In embodiments where a wet treatment is used, an RCA cleaning process may be used, for example. Through the activation treatment, the number of OH groups at surface(s) of the insulating bonding layer 102 and/or the insulating bonding layer 78 increases. After surfaces of the insulating bonding layer 102 and/or the insulating bonding layer 78 are activated, the insulating bonding layer 102 and the insulating bonding layer 78 may be contacted together at a relatively low temperature (e.g., room temperature) to form weak bonds. Subsequently, an annealing is performed to strengthen the weak bonds and form a fusion bond. During the annealing, the H of the OH bonds is outgassed, thereby forming Si—O—Si bonds between the insulating bonding layer 102 and the insulating bonding layer 78, thereby strengthening the bonds (e.g., forming covalent bonds).

Figure 8:
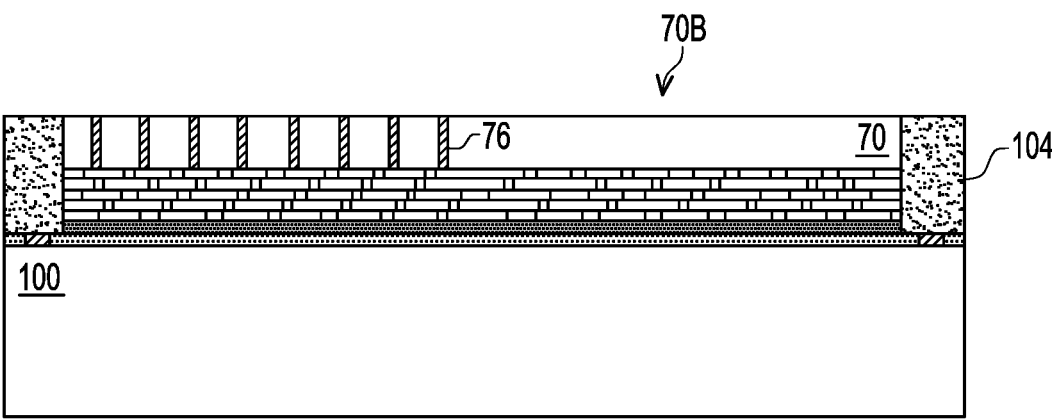

In FIG. 8, an insulating material 104 is formed over the carrier substrate 100 and around the integrated circuit die 70. In some embodiments, the insulating material 104 is a dielectric, gap fill material, such as silicon oxide, silicon nitride, silicon oxynitride, silicon oxycarbonitride, combinations thereof, or the like that is deposited by PVD, CVD, or the like. In some embodiments, the insulating material 104 is a molding material or compound that is formed by compression molding, transfer molding, or the like followed by a curing process. The molding material may or may not include filler materials (e.g., silica fillers). The insulating material 104 may be formed over the front side 70F of the integrated circuit die 70 such that the integrated circuit die 70 is at least partially buried or covered. A planarization process may be performed to planarize the top surface of the insulating material 104 and the backside 70B the integrated circuit die 70. The planarization process may be a CMP, an etch-back, combinations thereof, or the like. In the illustrated embodiment, the integrated circuit die 70 is exposed by the planarization of the insulating material 104 such that top surfaces of the integrated circuit die 70 and the insulating material 104 are substantially level (within process variations). The planarization may also remove portions of the semiconductor substrate 72 to expose the conductive vias 76. The insulating material 104 surrounds and protects integrated circuit die 70.

Figure 9:
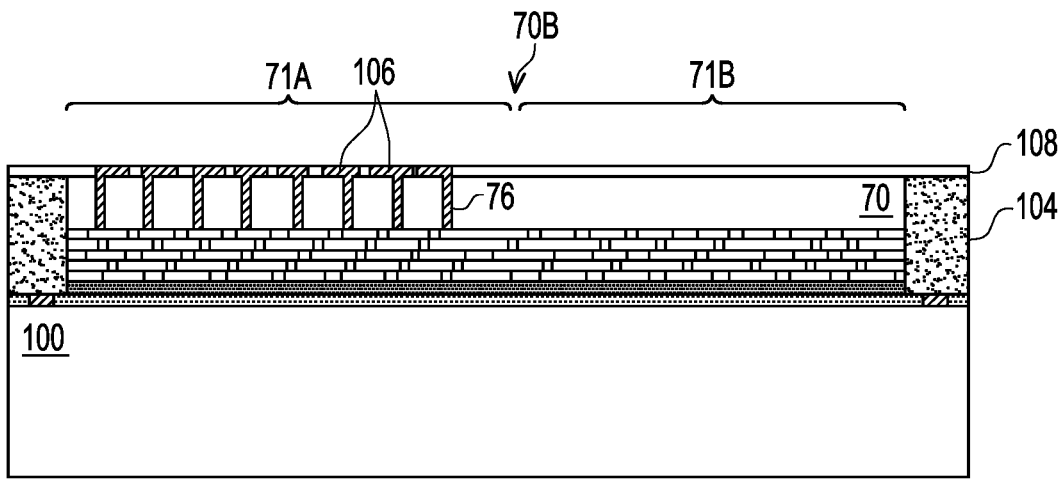

In FIG. 9, an insulating bonding layer 108 and bond pads 106 on the backside 70B of the integrated circuit die 70. The insulating bonding layer 108 and the bond pads 106 may be made of a similar material similar processes as the insulating bonding layer 68 and the bond pads 66, respectively as described above. The insulating bonding layer 108 may be deposited to cover the backside 70B of the integrated circuit die 70 and the insulating material 104. The bond pads 106 may be formed over and in electrically connection with the conductive vias 76. In embodiments where the conductive vias 76 are not disposed in the second region 71B of the integrated circuit die 70, the bond pads 106 may also not be formed over the second region 71B of the integrated circuit die 70.

Figure 10:
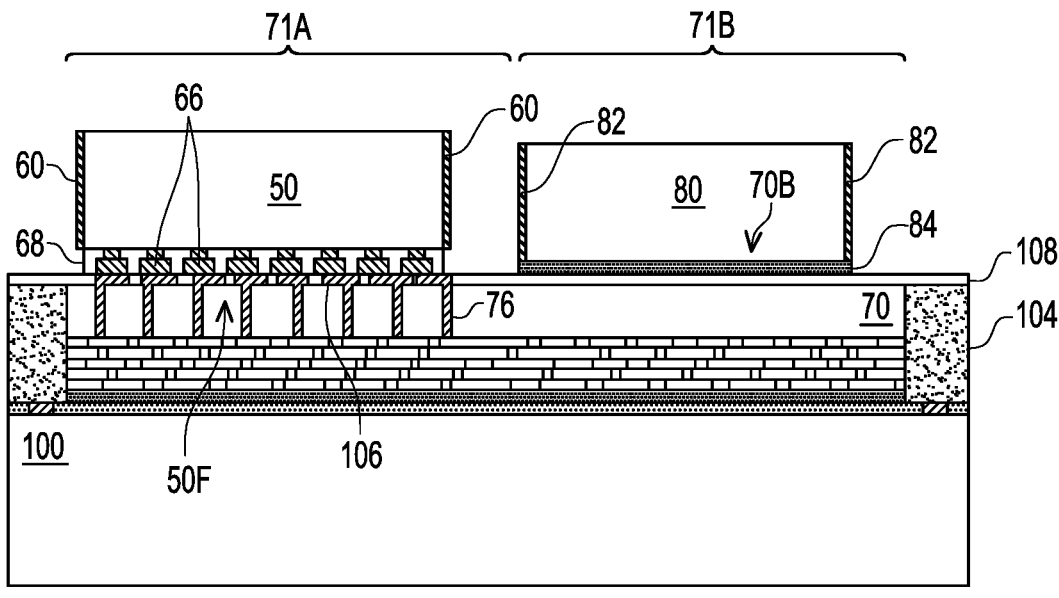

In FIG. 10, the integrated circuit die 50 is bonded to the integrated circuit die 70. In some embodiments, the integrated circuit die 50 performs a different function than the integrated circuit die 70. For example, the integrated circuit die 70 may be a logic processing die, and the integrated circuit die may be a memory die. In other embodiments, the integrated circuit dies 50 and 70 may perform different functions than logic processing/memory, or the integrated circuit dies 50 and 70 may perform a same function.

The integrated circuit die 50 and the integrated circuit die 70 are directly bonded in a face-to-back manner by a dielectric-to-dielectric bonding and metal-to-metal bonding process (sometimes referred to as hybrid bonding), such that the front sides 50F of the integrated circuit die 50 is bonded to the backside side 70B of the integrated circuit die 70. Specifically, the insulating bonding layer 68 of the integrated circuit die 50 is bonded to the insulating bonding layer 108 on the integrated circuit die 70 through dielectric-to-dielectric bonding, without using any adhesive material (e.g., die attach film), and the bond pads 66 of the integrated circuit die 50 is bonded to the bond pads 106 on the integrated circuit die 70 through metal-to-metal bonding, without using any eutectic material (e.g., solder). The bonding may include a surface activation, a pre-bonding, and an annealing. The surface activation may include activating the insulating bonding layer 108 and/or the insulating bonding layer 68 may be performed using, e.g., a dry treatment, a wet treatment, a plasma treatment, exposure to $H_2$, exposure to $N_2$, exposure to $O_2$, combinations of these, or the like. In embodiments where a wet treatment is used, an RCA cleaning process may be used, for example. Through the activation treatment, the number of OH groups at surface(s) of the insulating bonding layer 108 and/or the insulating bonding layer 68 increases. After surfaces of the insulating bonding layer 108 and/or the insulating bonding layer 68 are activated, a pre-bonding is performed by applying a small pressing force to press the integrated circuit die 50 against the integrated circuit die 70. The pre-bonding is performed at a low temperature, such as room temperature, such as a temperature in the range of about 15° C. to about 30° C. The bonding strength of the insulating bonding layers 68 and 108 is then improved in a subsequent annealing step, in which the insulating bonding layers 68 and 108 are annealed at a high temperature, such as a temperature in the range of about 100° C. to about 450° C. After the annealing, bonds, such as covalent bonds, are formed bonding the insulating bonding layers 68 and 108. The bond pads 66 and 106 are connected to each other with a one-to-one correspondence. The bond pads 66 and 106 may be in physical contact after the pre-bonding, or may expand to be brought into physical contact during the annealing. Further, during the annealing, the material of the bond pads 66 and 106 (e.g., copper) intermingles, so that metal-to-metal bonds are also formed.

Hence, the resulting bonds are hybrid bonds that include both dielectric-to-dielectric bonds and metal-to-metal bonds. The integrated circuit die 50 may be bonded on the first region 71A of the integrated circuit die 70 in which the conductive vias 76 are disposed. As a result, the circuitry within the integrated circuit die 50 may be electrically connected to circuitry within the integrated circuit die 70 through the bond pads 68 and the conductive vias 76.

As also illustrated by the FIG. 10, a dummy die 80 is bonded over the second region 81B of the integrated circuit die 70. The dummy die 80 may be a bulk semiconductor die (e.g., a silicon die) or the like that is free of any devices disposed therein. The dummy die 80 may be included to facilitate heat dissipation away from the integrated circuit die 70 in the completed package. In some embodiments, the dummy die 80 may be formed initially in a wafer, and a singulation process similar to that described above in FIGS. 2 through 5 may be applied to separate the dummy die 80 from the wafer. Specifically, a surface treatment may be performed on the dummy die 80 such that the dummy die 80 has hydrophobic sidewalls provided by surface regions 82. In embodiments where the surface treatment performed on the dummy die 80 is a fluorine-based treatment, the surface regions 82 also comprise fluorine. In some embodiments, a fluorine concentration of the surface regions 82 may be at least 5 wt % to provide the hydrophobic sidewalls and achieve the benefits described above (e.g., clean separation and reduced residue on the dummy dies 80). An insulating bonding layer 84 may be disposed on the dummy die 80, and the insulating bonding layer 84 may directly bond the dummy die 80 to the insulating bonding layer 108 with a dielectric-to-dielectric bonding process. Specifically, the insulating bonding layers 84 and 108 may be bonded together with a similar process as bonding the insulating bonding layers 78 and 102, described above.

Figure 11:
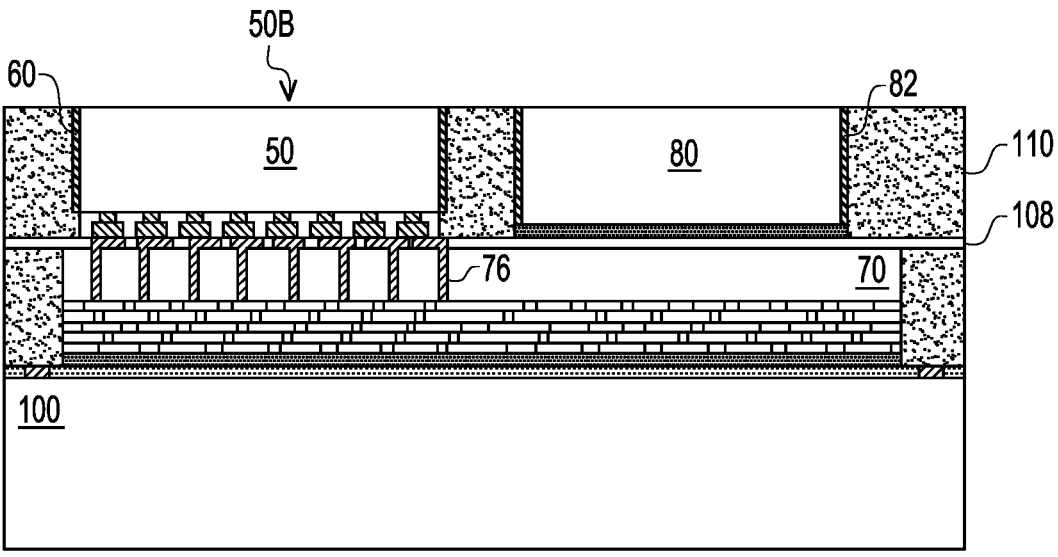

In FIG. 11, an insulating material 110 is formed over the insulating bonding layer 108 and around the integrated circuit die 50 and the dummy die 80. The insulating material 110 may be formed of a similar material using similar processes as the insulating material 104, described above. For example, in some embodiments, the insulating material 110 is a dielectric, gap fill material, such as silicon oxide, silicon nitride, silicon oxynitride, silicon oxycarbonitride, combinations thereof, or the like that is deposited by PVD, CVD, or the like. In some embodiments, the insulating material 110 is a molding material or compound that is formed by compression molding, transfer molding, or the like followed by a curing process. The molding material may or may not include filler materials (e.g., silica fillers). A planarization process may be performed to planarize the top surface of the insulating material 110 and the backside 50B the integrated circuit die 50. The planarization process may be a CMP, an etch-back, combinations thereof, or the like. In the illustrated embodiment, the integrated circuit die 50 and the dummy die 80 are exposed by the planarization of the insulating material 110 such that top surfaces of the integrated circuit die 50, the dummy die 80, and the insulating material 104 are substantially level (within process variations).

As a result of the singulation process described above in FIGS. 2 through 5, sidewalls of the integrated circuit die 50 and/or the dummy die 80 may be hydrophobic and include surfaces regions 60 and 82. The hydrophobic sidewalls repels any undesired residue from previous process steps from accumulating on the sidewalls of the integrated circuit die 50 and/or the dummy die 80. Thus, the insulating material 110 may be deposited around the integrated circuit die 50 and the dummy die 80 with improved adherence to the sidewalls of the integrated circuit die 50 and the dummy die 80, and manufacturing defects can be reduced.

Figure 12:
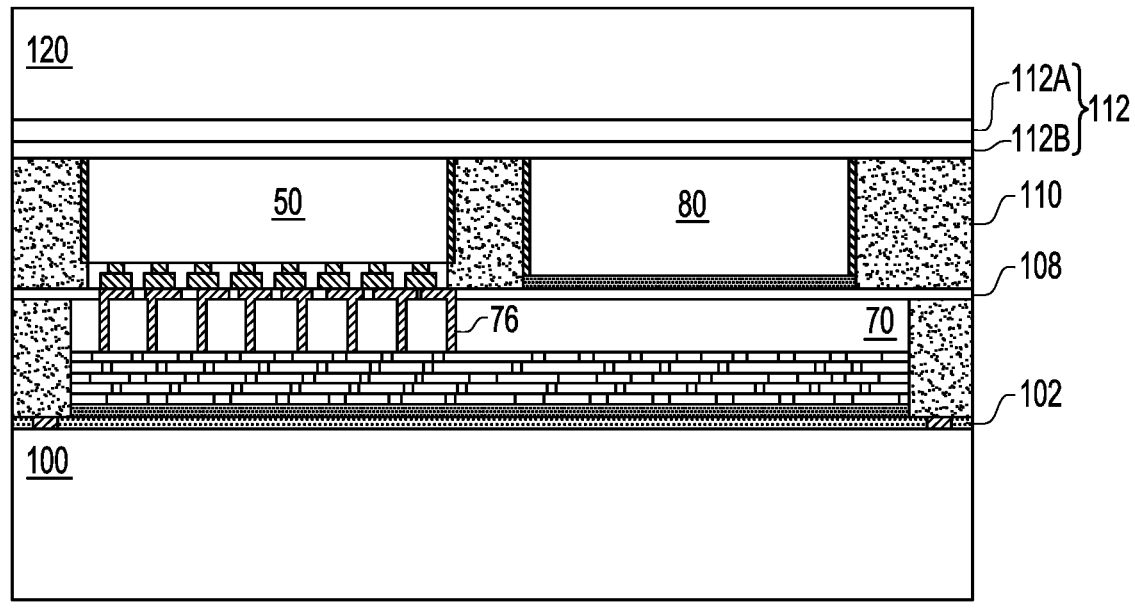

In FIG. 12, a carrier substrate 120 is attached over the integrated circuit die 50, the dummy die 80, and the insulating material 110. The carrier substrate 120 may be substantially similar to the carrier substrate 100, described above. To attach the carrier substrate 120, an insulating bonding layer 112A is deposited over the integrated circuit die 50, the dummy die 80, and the insulating material 110, and an insulating bonding layer 112B are deposited over the carrier substrate 120. The insulating bonding layers 112A and 112B may be made of a similar material using similar processes as the insulating bonding layer 102, described above. The insulating bonding layers 112A and 112B may then be bonded together with a similar dielectric-to-dielectric bonding process as bonding the insulating bonding layers 78 and 102, described above. The resulting bonded insulating bonding layers 112A and 112B may be collectively referred to as a bonded layer 112. As a result, the carrier substrate 120 is bonded over the integrated circuit die 50, the dummy die 80, and the insulating material 110.

Figure 13:
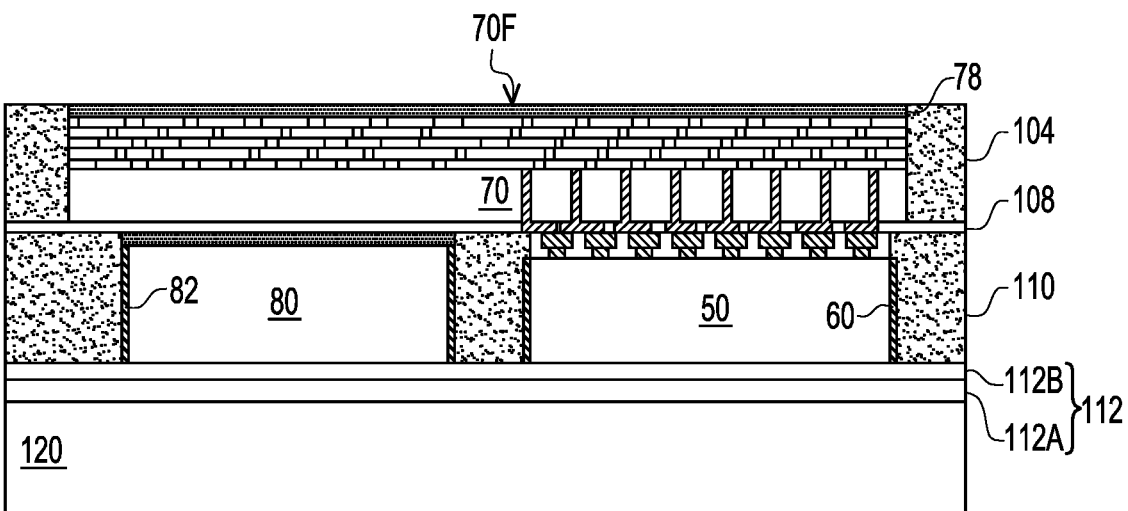

In FIG. 13, the entire structure may be flipped over, and the carrier substrate 100 may be removed from the front side 70F of the integrated circuit die 70. Removing the carrier substrate 100 may include a planarization process, such as a CMP, a grinding, an etch back, combinations thereof or the like. Removing the carrier substrate 100 may further remove the insulating bonding layer 102 and expose the integrated circuit die 70 and the insulating material 104.

Figure 14A:
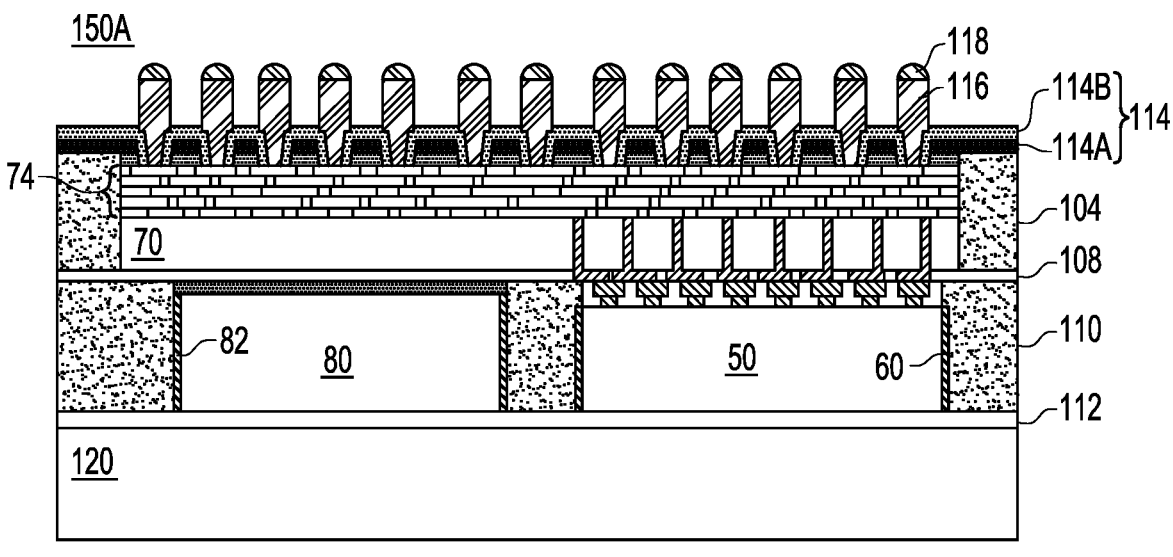
Figure 14B:
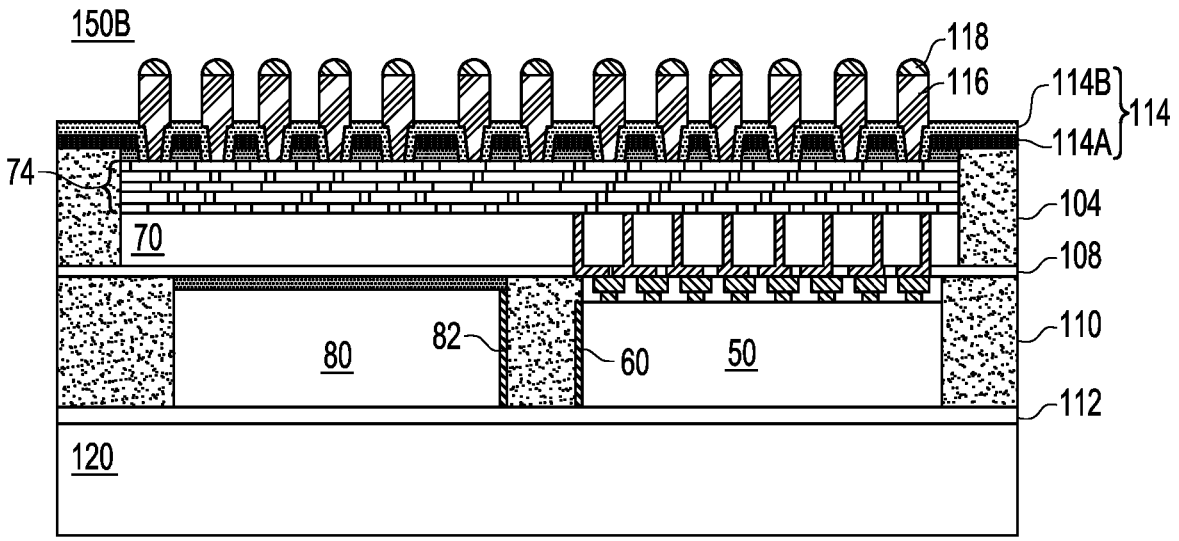

In FIGS. 14A and 14B, one or more passivation layers 114 are formed over the integrated circuit die 70 and the insulating material 110. The passivation layers 114 may comprise a dielectric material (e.g., silicon oxide, silicon nitride, silicon oxynitride, or the like), a polymer material (e.g., a polyimide, polybenzoxazole (PBO), polyimide, a benzocyclobuten (BCB) based polymer, or the like), or combinations thereof. For example, the passivation layer 114 may include a dielectric layer 114A and a polymer layer 114B over the dielectric layer 114A. Other configurations of the passivation layer 114 are also possible.

Additionally, under bump metallurgies (UBMs) 116 are formed on and extending through the passivation layer 114. The UBMs 116 may be electrically connected to metallization patterns in the interconnect structure 74 of the integrated circuit die 70. As an example to form the UBMs 116, openings may be patterned in the passivation layer 114 to expose the interconnect structure 74. Patterning the openings may be achieved by a combination of photolithography and etching in some embodiments. In other embodiments, the openings in the passivation layer 114 may be achieved by laser drilling, for example. A seed layer (not illustrated) is formed in the openings. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 116.

Further, conductive connectors 118 are formed on the UBMs 116. The conductive connectors 118 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 118 may include a conductive material such as solder, copper, aluminum, gold, nickel, silver, palladium, tin, the like, or a combination thereof. In some embodiments, the conductive connectors 118 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 118 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Thus, semiconductor packages 150A and 150B are formed. FIG. 14A illustrates the semiconductor package 150A where the surface regions 60 and the surface regions 82 are formed on all sidewalls of the integrated circuit die 50 and the dummy die 80, respectively. As a result, all sidewalls of the integrated circuit die 50 and the dummy die 80 are hydrophobic and may comprise fluorine. FIG. 14B illustrates the semiconductor package 150B where the surface regions 60 and the surface regions 82 are only formed on a subset sidewalls of the integrated circuit die 50 and the dummy die 80, respectively. As a result, some sidewalls of the integrated circuit die 50 and the dummy die 80 are hydrophobic and may comprise fluorine while other sidewalls of the integrated circuit die 50 and the dummy die 80 are hydrophilic and may not substantially comprise any fluorine (e.g., less than 5 wt % fluorine).

FIGS. 7 through 14B illustrate a packaging process where the integrated circuit dies 70 were not subjected to a surface treatment (e.g., a fluorine-based treatment) to form hydrophobic sidewall regions. In other embodiments, a surface treatment may be performed on the integrated circuit dies 70 in a substantially similar process as described above in FIGS. 2-5. In such embodiments, sidewalls of the integrated circuit die 70 may include surface regions that are hydrophobic (e.g., having fluorine-comprising surface regions with more than 5 wt % of fluorine). FIGS. 15 through 18B illustrates intermediate processing steps of packaging integrated circuit dies 70 having hydrophobic surface regions with integrated circuit dies 50. In FIGS. 15 through 18B, like reference numerals indicate like elements formed by like processes as the embodiments of FIGS. 7 through 14B unless otherwise noted.

Figures 15, 16:
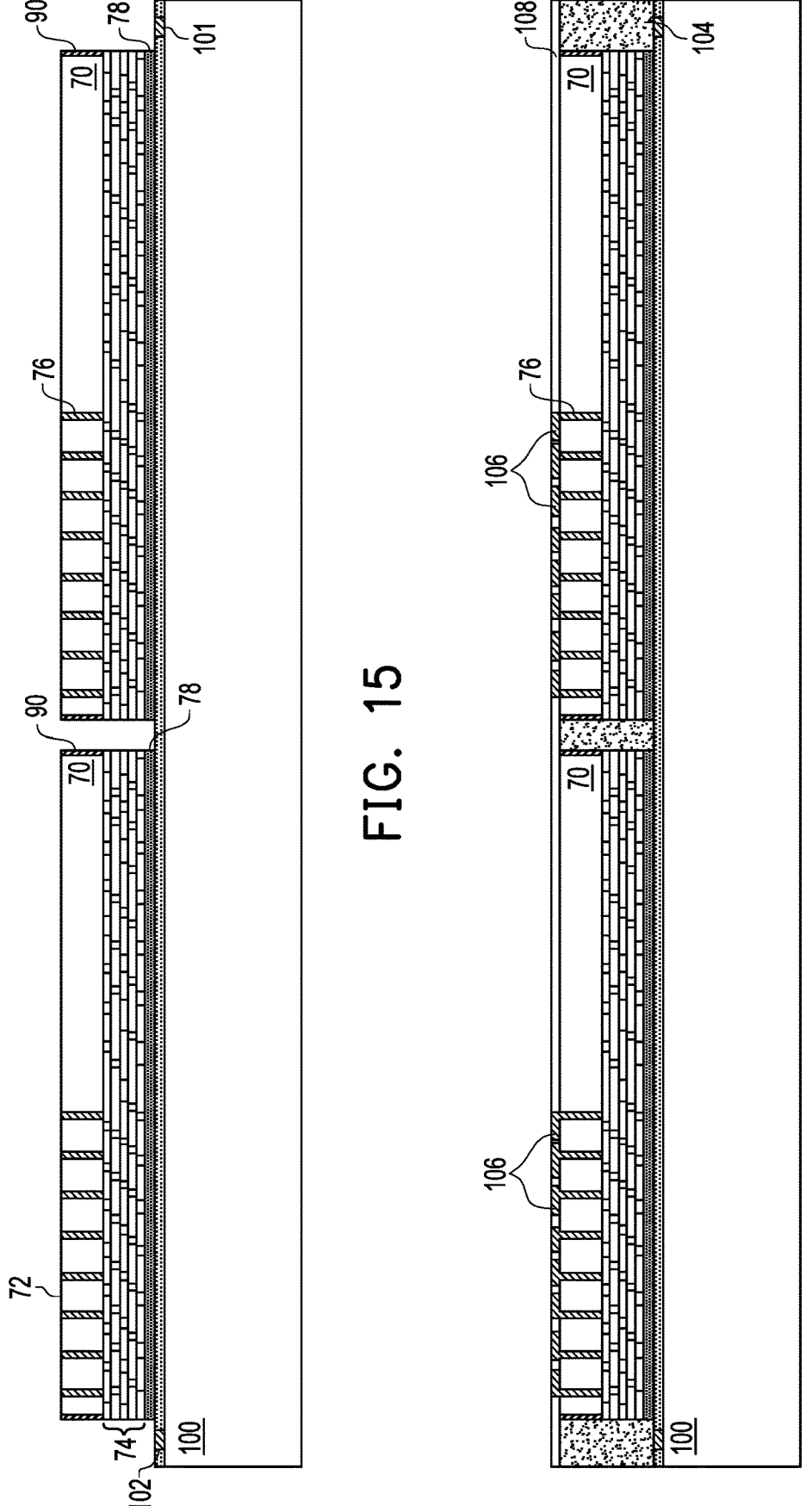
FIGS. 15, 16, 17, 18A, and 18B illustrate cross-sectional views of various intermediate steps of packaging an integrated circuit die in accordance with various embodiments.

In FIG. 15, integrated circuit dies 70 are attached to a carrier substrate 100. Each of the integrated circuit dies 70 include a semiconductor substrate 72, an interconnect structure 74, and conductive vias 76 embedded in the semiconductor substrate 72 as described above in FIG. 7. The integrated circuit dies 70 may be initially formed as part of a wafer and are then singulated using the singulation process described above in FIGS. 2 through 5. Specifically, trenches may be patterned in the wafer along scribe line regions as described in FIG. 2. Then, a surface treatment, such as a fluorine-based treatment may be performed in the trenches as described in FIG. 3. The fluorine-based treatment creates surface regions 90 on sidewalls of the trenches (which also correspond to sidewalls of the semiconductor substrate 72 and the interconnect structure 74). In some embodiments, the surface regions 90 comprise fluorine, such as fluorine at a concentration of 5 wt % or more to create hydrophobic sidewalls in the trenches. It has been observed that when the surfaces regions 90 have less than 5 wt % of fluorine, they may remain hydrophilic and not significantly prevent deposition of the subsequently formed protective layer in the trenches. The surface regions 90 may further comprise carbon, oxygen, silicon, nitrogen, or a combination thereof. The specific material composition of the surface regions 90 may depend on a material of the interconnect structure 74 and/or semiconductor substrate 72 on which the surface regions 90 are formed. For example, portions of the surface regions 90 on the semiconductor substrate 72 may comprise fluorine and silicon while portions of the surface regions 90 on the interconnect structure 74, which may comprise fluorine in combination with carbon, oxygen, nitrogen and/or silicon. A thickness of the surface regions 90 may be in a range of 60 Å to 10 μm.

After the surface treatment is performed, a backside planarization process may be performed to remove portions of the semiconductor substrate 72 connecting the integrated circuit dies 70 to the wafer using a similar process a described in FIG. 5. The backside planarization process may or may not expose the conductive vias 76. During the backside planarization process, the wafer may be attached to a tape, and a protective layer may cover a front side of the wafer to prevent damage from direct contact with the tape. Due to the surface treatment and hydrophobic sidewalls in the trenches, the material of the protective layer is not deposited within the trenches, allowing for improved separation of the integrated circuit dies 70 and avoiding undesired surface residue on the sidewalls of the integrated circuit dies 70. The tape and protective layer may then be removed as described above, resulting in fully singulated integrated circuit dies 70. The singulated, integrated circuit dies may then be bonded to the carrier substrate 100 by insulating bonding layers 78 and 102 in a similar manner as described above FIG. 7. Although FIG. 15 illustrates two integrated circuit dies 70 being bonded to the carrier substrate 100, any number of integrated circuit dies 70 may be bonded to the carrier substrate 100.

In FIG. 16, an insulating material 104 is deposited around the integrated circuit dies 70 in a similar manner as described above in FIG. 8. Due the hydrophobic surface regions 90, surface residue on the sidewalls of the integrated circuit dies 70 can be reduced, and the insulating material 104 can be deposited with improved adhesion and fewer defects (e.g., gaps) around the integrated circuit dies 70. Further in FIG. 16, an insulating bonding layer 108 is deposited over the integrated circuit dies 70, and bond pads 106 are formed on the conductive vias 76 of the integrated circuit dies 70. The insulating bonding layer 108 and the bond pads 106 may be formed in similar manner as described above in FIG. 9. In embodiments where in the integrated circuit dies 70 includes regions free of the conductive vias 76, the bond pads 106 may likewise not be formed on the regions free of the conductive vias 76.

Figures 17, 18A:
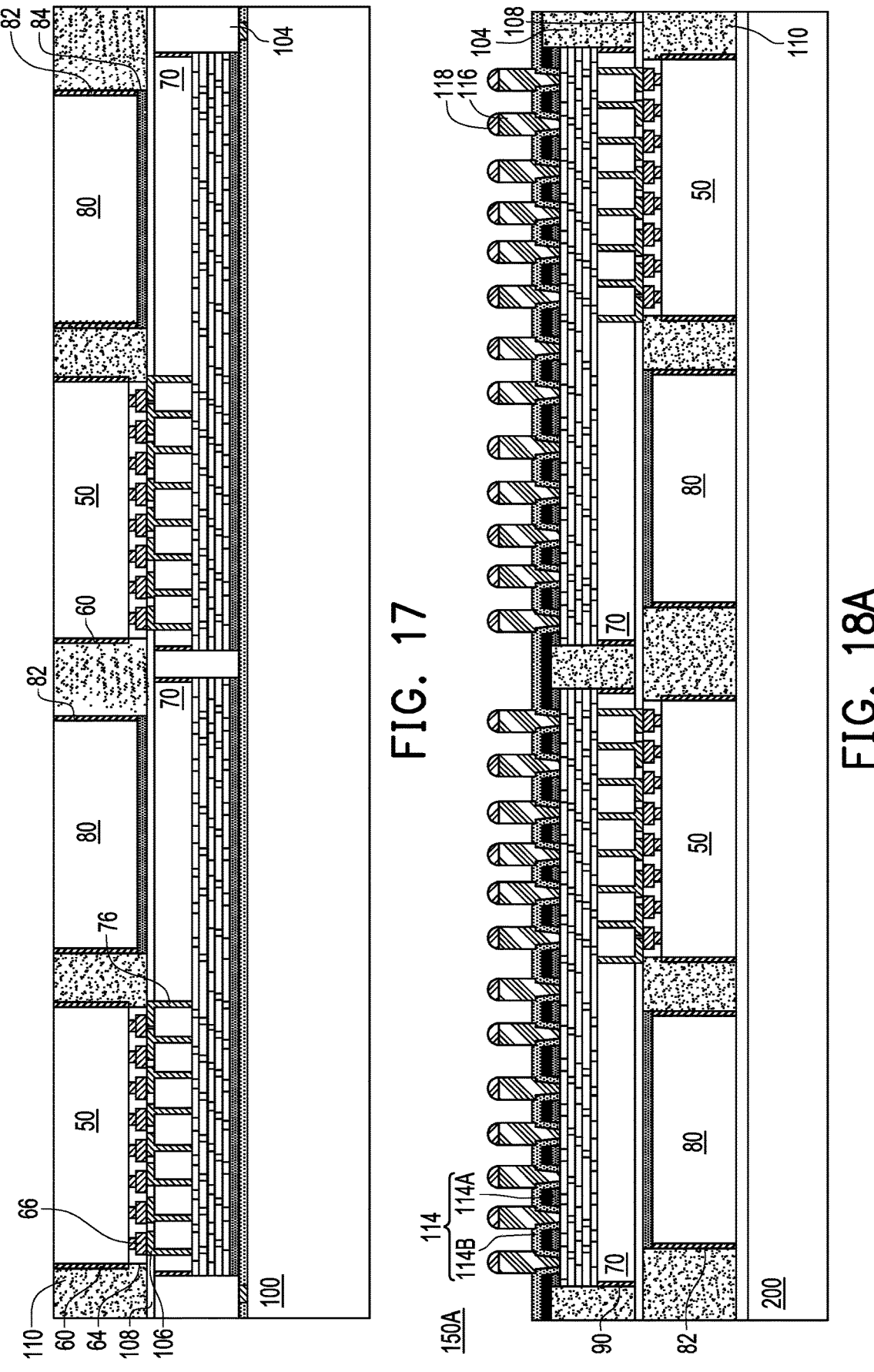

In FIG. 17, the integrated circuit dies 50 and the dummy dies 80 are bonded to the integrated circuit dies 70 in a similar manner as described above in FIG. 10. For example, the integrated circuit dies 50 may be directly bonded to the integrated circuit dies 70 by dielectric-to-dielectric and metal-to-metal bonds, and the circuitry within the integrated circuit dies 50 may be electrically connected to the circuitry within the integrated circuit dies 70 by the conductive vias 76, the bond pads 106, and the bond pads 66. Further, the dummy dies 80 may be directly bonded to the integrated circuit dies 70 by direct dielectric-to-dielectric bonding through the insulating bonding layers 108 and 84. The integrated circuit dies 50 and the dummy dies 80 may include hydrophobic surface regions 60 and 82, respectively as described above. Further in FIG. 17, an insulating material 110 is formed around the integrated circuit dies 50 and the dummy dies 80 in a similar manner as described above in FIG. 11.

Figure 18B:
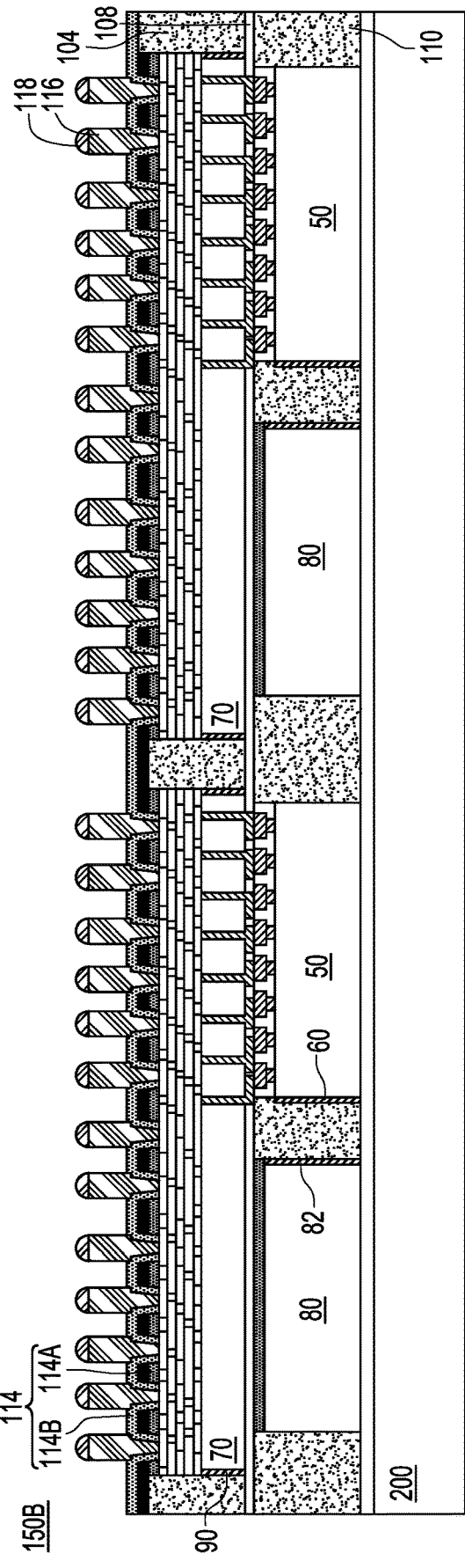

In FIGS. 18A and 18B, a carrier substrate 200 is bonded to the integrated circuit dies 50, the dummy dies 80, and the insulating material 110, and the carrier substrate 100 is removed in a similar manner as described above in FIGS. 12 through 13. Further, one or more passivation layers 114 is formed over the integrated circuit dies 70 and the insulating material 104 in a similar manner as described above in FIGS. 14A and 14B. Then, UBMs 116 and conductive connectors 118 are formed through the passivation layers 114 to electrically connect to the integrated circuit dies 50 and 70 as described above in FIGS. 14A and 14B.

FIG. 18A illustrates the semiconductor package 152A where the surface regions 90 are formed on all sidewalls of the integrated circuit dies 70. As a result, all sidewalls of the integrated circuit dies 70 are hydrophobic and may comprise fluorine. FIG. 18B illustrates the semiconductor package 152B where the surface regions 90 are only formed on a subset sidewalls of the integrated circuit dies 70. As a result, some sidewalls of the integrated circuit dies 70 are hydrophobic and may comprise fluorine while other sidewalls of the integrated circuit dies 70 are hydrophilic and may not substantially comprise any fluorine (e.g., less than 5 wt % fluorine).

According to various embodiments, a singulation process is performed to separate individual semiconductor dies from a wafer. The singulation process may include patterning trenches in the scribe line regions of the wafer, and performing a surface treatment to provide hydrophobic sidewalls in the trenches. In some embodiments, the surface treatment is a fluorine-based treatment. The hydrophobic sidewalls may prevent a protective layer (e.g., a back side anti-reflective coating (BARC) layer or the like) from being deposited in the trenches in a subsequent singulation step. A planarization process may then be performed to remove a backside of the wafer, separating the semiconductor dies along the trenches.

The protective coating layer may protect the semiconductor dies during the planarization process, and cleaning process may be used to remove the protective layer after the planarization process. Because the protective layer is not deposited in the trenches, the cleaning process may more effectively remove the protective layer, improving yield and reducing re-constructive wafer (RW) tool failure. For example, when the protective layer fills the trenches, the semiconductor dies may not be successfully separated from the wafer, resulting in RW failure. Further, the hydrophobic sidewalls prevent undesired residue on the sidewalls of the integrated circuit dies, which helps reduce manufacturing defects during later packaging steps.

In some embodiments, a package includes a first integrated circuit die; a second integrated circuit die over and bonded to the first integrated circuit die, and a first insulating material over the first integrated circuit and surrounding the second integrated circuit die. A first surface region of the second integrated circuit die is hydrophobic, and the first integrated circuit die and the second integrated circuit die are bonded together with dielectric-to-dielectric bonds and metal-to-metal bonds. The first insulating material contacts the first surface region. In some embodiments, the first surface region of the second integrated circuit die comprises fluorine. In some embodiments, wherein a fluorine concentration of the first surface region is at least 5 wt %. In some embodiments, the first surface region further comprises carbon, oxygen, silicon, nitrogen, or a combination thereof. In some embodiments, the package further includes a dummy die bonded to the first integrated circuit die with dielectric-to-dielectric bonds, wherein the first insulating material surrounds the dummy die. In some embodiments, a second surface region of the dummy die is hydrophobic and comprises fluorine. In some embodiments, a third surface region of the first integrated circuit die is hydrophobic and comprises fluorine. In some embodiments, the package further includes a second insulating material surrounding the first integrated circuit die, wherein the second insulating material contacts the third surface region.

In some embodiments, a package includes a package comprising a first integrated circuit die; a first insulating material surrounding the first integrated circuit die; a second integrated circuit die over and bonded to the first integrated circuit die, and a second insulating material over the first integrated circuit and surrounding the second integrated circuit die. A first surface region of the second integrated circuit die comprises fluorine, wherein a fluorine concentration of the first surface region is at least 5 wt %, and the first surface region is disposed at an interface between the second insulating material and the second integrated circuit die. In some embodiments, a second surface region of the first integrated circuit die comprises fluorine, and the second surface region is disposed at an interface between the first insulating material and the first integrated circuit die. In some embodiments, a fluorine concentration of the second surface region is at least 5 wt %. In some embodiments, the package further includes a dummy die bonded to the first integrated circuit die and disposed at a same level as the second integrated circuit die, wherein a third surface region of the dummy die comprises fluorine, wherein a fluorine concentration of the third surface region is at least 5 wt %, and wherein the third surface region is disposed at an interface between the second insulating material and the second integrated circuit die. In some embodiments, the second integrated circuit die is bonded to the first integrated circuit die with dielectric-to-dielectric bonds and metal-to-metal bonds.

In some embodiments, a method includes etching a trench through an interconnect structure and extending into a semiconductor substrate, the trench being disposed in a scribe line region that is disposed between a first integrated circuit die and a second integrated circuit die; performing a surface treatment in the first trench to form a first surface region in a first sidewall of the first integrated circuit die, wherein the first surface region is hydrophobic; depositing a protective layer over the first integrated circuit die and covering the trench; attaching a tape to a surface of the protective layer opposite to the first integrated circuit die; performing a backside planarization on a surface of the semiconductor substrate opposite to the tape; and after performing the backside planarization, removing the protective layer and the tape to fully separate the first integrated circuit die from the second integrated circuit die. In some embodiments, the surface treatment is a fluorine based treatment. In some embodiments, the fluorine base treatment is a wet cleaning process using a fluorine-comprising solution or a fluorine-based plasma process. In some embodiments, the method further includes bonding the first integrated circuit die to a third integrated circuit die; and depositing an insulating material around the first integrated circuit die, wherein the insulating material contacts the first surface region. In some embodiments, the third integrated circuit die comprises a second surface region in a second sidewall of the third integrated circuit die, wherein the second surface region is hydrophobic. In some embodiments, the method further includes bonding a dummy die to the third integrated circuit die, wherein the dummy die comprises a third surface region in a third sidewall of the dummy die, wherein the third surface region is hydrophobic, and wherein the insulating material contacts the third surface region. In some embodiments, etching the trench comprises etching the trench through a patterned photoresist on a top surface of the interconnect structure, and wherein performing the surface treatment comprises performing the surface treatment while the patterned photoresist covers the top surface of the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first integrated circuit die;
a second integrated circuit die over and bonded to the first integrated circuit die, wherein a first surface region of the second integrated circuit die is hydrophobic, and wherein the first integrated circuit die and the second integrated circuit die are bonded together with dielectric-to-dielectric bonds and metal-to-metal bonds; and
a first insulating material over the first integrated circuit die and surrounding the second integrated circuit die, wherein the first insulating material contacts the first surface region.

2. The package of claim 1, wherein the first surface region of the second integrated circuit die comprises fluorine.

3. The package of claim 2, wherein a fluorine concentration of the first surface region is at least 5 wt %.

4. The package of claim 2, wherein the first surface region further comprises carbon, oxygen, silicon, nitrogen, or a combination thereof.

5. The package of claim 1 further comprising a dummy die bonded to the first integrated circuit die with dielectric-to-dielectric bonds, wherein the first insulating material surrounds the dummy die.

6. The package of claim 5, wherein a second surface region of the dummy die is hydrophobic and comprises fluorine.

7. The package claim 1, wherein a third surface region of the first integrated circuit die is hydrophobic and comprises fluorine.

8. The package of claim 7 further comprising a second insulating material surrounding the first integrated circuit die, wherein the second insulating material contacts the third surface region.

9. A package comprising:
a first integrated circuit die;
a first insulating material surrounding the first integrated circuit die;
a second integrated circuit die over and bonded to the first integrated circuit die, wherein a first surface region of the second integrated circuit die comprises fluorine, wherein a fluorine concentration of the first surface region is at least 5 wt %; and
a second insulating material over the first integrated circuit die and surrounding the second integrated circuit die, wherein the first surface region is disposed at an interface between the second insulating material and the second integrated circuit die.

10. The package of claim 9, wherein a second surface region of the first integrated circuit die comprises fluorine, wherein the second surface region is disposed at an interface between the first insulating material and the first integrated circuit die.

11. The package of claim 10, wherein a fluorine concentration of the second surface region is at least 5 wt %.

12. The package of claim 9, further comprising a dummy die bonded to the first integrated circuit die and disposed at a same level as the second integrated circuit die, wherein a third surface region of the dummy die comprises fluorine, wherein a fluorine concentration of the third surface region is at least 5 wt %, and wherein the third surface region is disposed at an interface between the second insulating material and the second integrated circuit die.

13. The package of claim 9, wherein the second integrated circuit die is bonded to the first integrated circuit die with dielectric-to-dielectric bonds and metal-to-metal bonds.

14. A method comprising:
etching a trench through an interconnect structure and extending into a semiconductor substrate, the trench being disposed in a scribe line region that is disposed between a first integrated circuit die and a second integrated circuit die;
performing a surface treatment in the trench to form a first surface region in a first sidewall of the first integrated circuit die, wherein the first surface region is hydrophobic;
depositing a protective layer over the first integrated circuit die and covering the trench;
attaching a tape to a surface of the protective layer opposite to the first integrated circuit die;
performing a backside planarization on a surface of the semiconductor substrate opposite to the tape; and
after performing the backside planarization, removing the protective layer and the tape to fully separate the first integrated circuit die from the second integrated circuit die.

15. The method of claim 14, wherein the surface treatment is a fluorine based treatment.

16. The method of claim 15, wherein the fluorine base treatment is a wet cleaning process using a fluorine-comprising solution or a fluorine-based plasma process.

17. The method of claim 14 further comprising:

bonding the first integrated circuit die to a third integrated circuit die; and depositing an insulating material around the first integrated circuit die, wherein the insulating material contacts the first surface region.

18. The method of claim 17, wherein the third integrated circuit die comprises a second surface region in a second sidewall of the third integrated circuit die, wherein the second surface region is hydrophobic.

19. The method of claim 18 further comprising bonding a dummy die to the third integrated circuit die, wherein the dummy die comprises a third surface region in a third sidewall of the dummy die, wherein the third surface region is hydrophobic, and wherein the insulating material contacts the third surface region.

20. The method of claim 14, wherein etching the trench comprises etching the trench through a patterned photoresist on a top surface of the interconnect structure, and wherein performing the surface treatment comprises performing the surface treatment while the patterned photoresist covers the top surface of the interconnect structure.

\* \* \* \* \*